United States Patent
Higashi et al.

(10) Patent No.: US 10,316,429 B2
(45) Date of Patent: Jun. 11, 2019

(54) FILM FORMING APPARATUS AND FILM FORMING METHOD

(71) Applicants: Kabushiki Kaisha Toshiba, Minato-ku (JP); NuFlare Technology, Inc., Yokohama-shi (JP)

(72) Inventors: Shinya Higashi, Yokohama (JP); Kaori Deura, Yokohama (JP); Kunihiko Suzuki, Sunto (JP); Masayoshi Yajima, Ashigarakami (JP)

(73) Assignees: Kabushiki Kaisha Toshiba, Minato-ku (JP); NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/696,784

(22) Filed: Sep. 6, 2017

(65) Prior Publication Data

US 2018/0073163 A1    Mar. 15, 2018

(30) Foreign Application Priority Data

Sep. 14, 2016  (JP) ................................. 2016-179664

(51) Int. Cl.
*C30B 25/12*    (2006.01)
*H01L 21/67*    (2006.01)
(Continued)

(52) U.S. Cl.
CPC ............ *C30B 25/12* (2013.01); *C23C 16/455* (2013.01); *C23C 16/4584* (2013.01);
(Continued)

(58) Field of Classification Search
CPC ......... H01L 21/68742; H01L 21/67126; H01L 21/68764; C30B 25/12; C30B 25/08; Y10T 117/10
See application file for complete search history.

(56) References Cited

U.S. PATENT DOCUMENTS 5,088,444 A * 2/1992 Ohmine ............ H01L 21/67748
                                                  118/715
6,099,650 A * 8/2000 Carbonaro .............. C23C 16/46
                                                  117/200
(Continued)

FOREIGN PATENT DOCUMENTS

| JP | 2009-21533 A | 1/2009 |
| JP | 2009-260291 A | 11/2009 |
| JP | 2011-171450 A | 9/2011 |

*Primary Examiner* — Matthew J Song
(74) *Attorney, Agent, or Firm* — Oblon, McClelland, Maier & Neustadt, L.L.P.

(57) ABSTRACT

According to one embodiment, a film forming apparatus includes a process chamber, a placement portion, a susceptor, a cover, a gas source, a heater, and a support portion. The placement portion is provided inside the process chamber. The susceptor is held in an end portion of the placement portion and is capable of placing a substrate. The cover is capable of being placed facing the susceptor inside the process chamber. The gas source is capable of supplying a process gas between the cover and the substrate. The heater is capable of heating the substrate. The support portion is provided inside the process chamber and is capable of supporting the cover at a first position above the susceptor and is capable of separating the cover at a second position which is different from the first position.

19 Claims, 7 Drawing Sheets

(51) Int. Cl.
  *H01L 21/687* (2006.01)
  *C30B 25/08* (2006.01)
  *C23C 16/455* (2006.01)
  *C23C 16/458* (2006.01)
  *C30B 25/14* (2006.01)

(52) U.S. Cl.
  CPC .............. *C30B 25/08* (2013.01); *C30B 25/14* (2013.01); *H01L 21/67126* (2013.01); *H01L 21/68742* (2013.01); *H01L 21/68764* (2013.01); *Y10T 117/10* (2015.01)

(56) References Cited

U.S. PATENT DOCUMENTS

| | | | |
|---|---|---|---|
| 2005/0115947 A1* | 6/2005 | Hosokawa | F27B 17/0025 219/411 |
| 2008/0311294 A1 | 12/2008 | Ito et al. | |
| 2009/0238971 A1 | 9/2009 | Higashi et al. | |
| 2009/0241836 A1* | 10/2009 | Ishisaka | H01L 21/67109 118/723 R |
| 2011/0200749 A1 | 8/2011 | Suzuki et al. | |
| 2013/0108792 A1* | 5/2013 | Yang | C23C 16/45565 427/294 |

\* cited by examiner

FILM FORMING APPARATUS AND FILM FORMING METHOD

CROSS-REFERENCE TO RELATED APPLICATIONS

This application is based upon and claims the benefit of priority from Japanese Patent Application No. 2016-179664, filed on Sep. 14, 2016; the entire contents of which are incorporated herein by reference.

FIELD

An embodiment of the invention relates to a film forming apparatus and a film forming method.

BACKGROUND

There is a film formation device in which a single-crystal film is epitaxially grown on a surface of a substrate such as a wafer using a CVD (Chemical Vapor Deposition) method. In such a film forming apparatus, a process chamber, a susceptor, on which a substrate is placed, a heater which heats the substrate placed on the susceptor, a rotating portion which rotates the susceptor, a liner which has a cylindrical shape and is provided with one opening end facing the substrate, and a gas supply portion which supplies a process gas to the other opening end of the liner are provided. Further, there is also a case where a heater is further provided on an outer surface of the liner.

By providing the liner, the process gas supplied from the gas supply portion can be efficiently guided to the surface of the substrate.

However, when the liner is heated by the heater, a reaction product such as a crystal is formed also on an inner wall of the liner in some cases. When the reaction product is formed on the inner wall of the liner, due to repetitive rise and fall of temperature accompanying the operation of the film forming apparatus, the reaction product falls off and a particle may be generated. When a particle is generated, the particle becomes a factor to deteriorate the quality of a film formed on the surface of the substrate. In this case, if a process for performing an etching treatment of the wall surface after a film formation treatment of the substrate is added, or the operation of the film forming apparatus is stopped and the liner is cleaned on a regular basis, the generation of a particle can be suppressed. However, when a process for performing an etching treatment of the wall surface is added or the operation of the film forming apparatus is stopped for performing cleaning, operation efficiency is decreased. Further, in the case where the heater is provided on the outer surface of the liner, a temperature of the liner becomes higher than a temperature of the substrate, and therefore, the reaction product may be more likely to be formed, or a service life of the liner may be reduced.

Further, when a gas is supplied to a space partitioned by the substrate and the liner to effect heating, heat convection occurs. The occurrence of convection also affects the flow of the gas supplied to the substrate, and the uniformity of film formation may be deteriorated, a time for changing the type of gas may be increased, a reaction product generated on the surface of the substrate or in the vicinity of the substrate may be adhered to the liner. In order to prevent the occurrence of these problems, the liner is formed of a material resistant to high temperatures and has a large and complicated shape. Therefore, the production cost of the liner is high.

In view of this, development of a technique capable of improving the quality of the film and productivity has been demanded.

DETAILED DESCRIPTION

Figure 1:
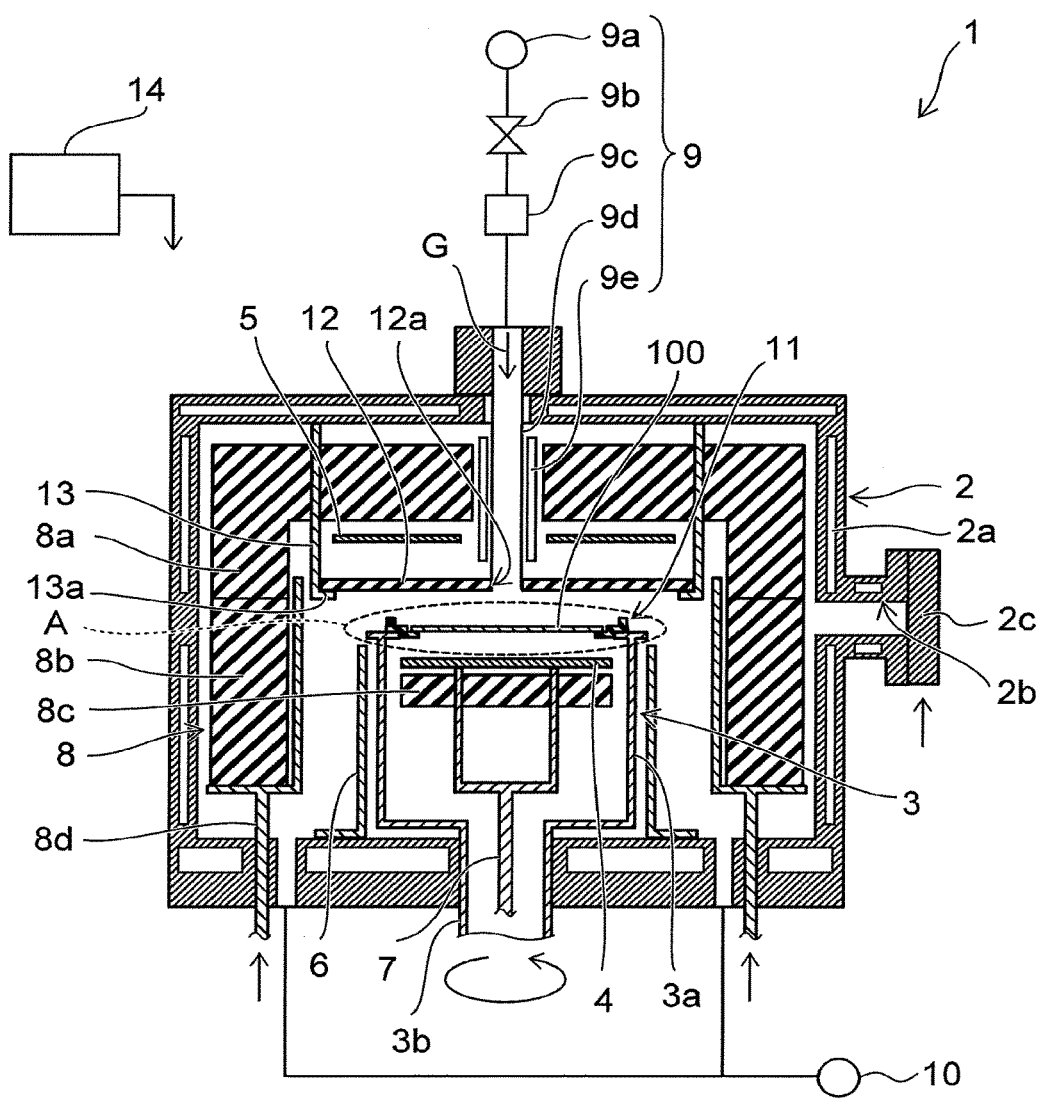
FIGS. 1 and 2 are schematic sectional views for illustrating a film forming apparatus according to a first embodiment.

According to one embodiment, a film forming apparatus includes a process chamber, a placement portion, a susceptor, a cover, a gas source, a heater, and a support portion. The placement portion is provided inside the process chamber. The susceptor is held in an end portion of the placement portion and is capable of placing a substrate. The cover is capable of being placed facing the susceptor inside the process chamber. The gas source is capable of supplying a process gas between the cover and the substrate. The heater is capable of heating the substrate. The support portion is provided inside the process chamber and is capable of supporting the cover at a first position above the susceptor and is capable of separating the cover at a second position which is different from the first position.

Embodiments will now be illustrated with reference to the drawings. Similar components in the drawings are marked with the same reference numerals; and a detailed description is omitted as appropriate.

First Embodiment

Figure 2:
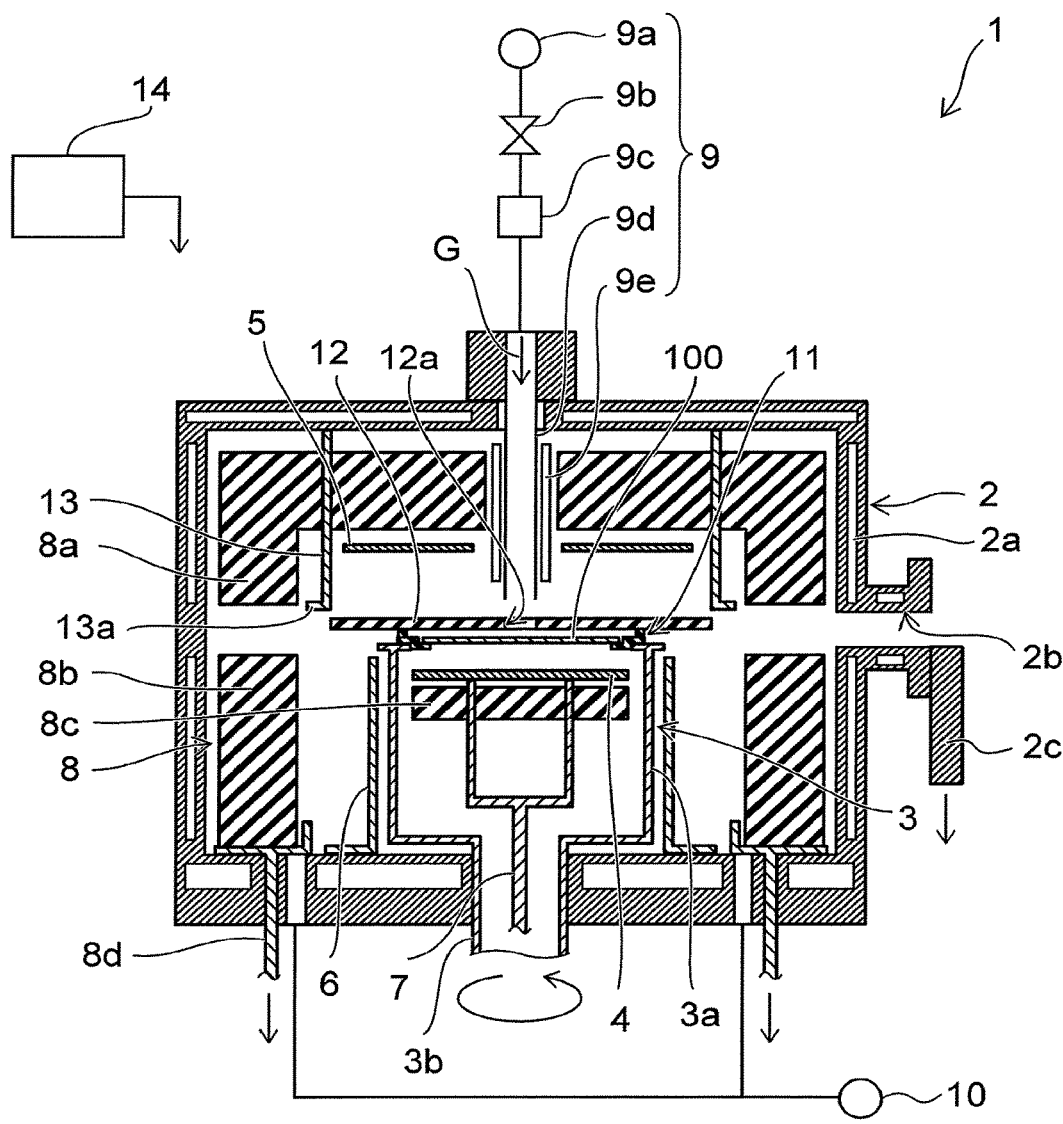

FIGS. 1 and 2 are schematic sectional views for illustrating a film forming apparatus 1 according to a first embodiment.

Incidentally, FIG. 1 shows a state when performing film formation, and FIG. 2 shows a state when transporting a substrate 100, a susceptor 11, and a cover 12.

Figure 3:
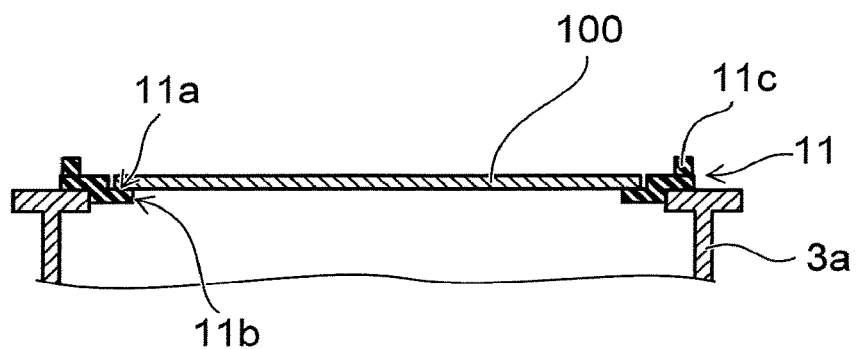
FIG. 3 is a schematic enlarged view of a portion A in FIG. 1.

FIG. 3 is a schematic enlarged view of a portion A in FIG. 1.

As shown in FIGS. 1 and 2, in the film forming apparatus 1, a process chamber 2, a rotating stage 3, a lower heater 4, an upper heater 5, a rotating stage cover 6, a push-up pin 7, a heat insulating portion 8, a gas supply portion 9, an exhaust portion 10, a susceptor 11, a cover 12, an upper support portion 13, and a control portion 14 are provided.

The process chamber 2 has a box shape. The process chamber 2 has an airtight structure capable of maintaining an atmosphere at a pressure lower than atmospheric pressure. In a wall surface of the process chamber 2, a flow channel 2a through which cooling water flows is provided. To the flow channel 2a, a cooling unit (not shown) is connected, and cooling water at about 20° C. circulates between the flow channel 2a and the cooling unit. On a side wall of the process chamber 2, a transport gate 2b is provided. A gate valve 2c opens and closes an opening of the transport gate 2b.

The rotating stage 3 has a placement portion 3a and a rotation shaft 3b.

The placement portion 3a is provided inside the process chamber 2. The placement portion 3a has a cylindrical shape with one end closed. In an end portion on a side of an opening of the placement portion 3a, the susceptor 11 is placed. The placed susceptor 11 is held detachably from the placement portion 3a. The rotation shaft 3b has a cylindrical shape. To the end portion on a closed side of the placement portion 3a, one end portion of the rotation shaft 3b is connected. The other end portion of the rotation shaft 3b is provided outside the process chamber 2. That is, the rotation shaft 3b pierces a bottom portion of the process chamber 2. To the other end portion of the rotation shaft 3b, a motor (not shown) is connected. The motor performs rotation of the rotating stage 3, stopping of the rotation, changing of the number of rotations (rotation speed), and the like.

The lower heater 4 is provided inside the placement portion 3a. The lower heater 4 heats the substrate 100 placed on the susceptor 11.

The upper heater 5 is provided between an upper insulating portion 8a and the cover 12. The upper heater 5 heats the substrate 100 through the cover 12. The upper heater 5 is not necessarily essential, however, for example, in the case where film formation is performed at a high temperature as in the case of an SiC (silicon carbide) film or the like, it is preferred to provide the upper heater 5.

The rotating stage cover 6 has a cylindrical shape, and is provided inside the process chamber 2. The rotating stage cover 6 surrounds the placement portion 3a. The rotating stage cover 6 is fixed to a bottom surface of the process chamber 2.

The push-up pin 7 is provided inside the placement portion 3a. To an end portion on an opposite side to the susceptor 11 of the push-up pin 7, an elevating device (not shown) is connected. The push-up pin 7 performs reception and delivery of the susceptor 11 between the placement portion 3a and a transport device (not shown).

The heat insulating portion 8 has the upper insulating portion 8a, a lower insulating portion 8b, a heat insulating portion 8c for the lower heater, and an elevating portion 8d.

The upper insulating portion 8a is provided on a side of a ceiling inside the process chamber 2. On a surface on a side of the rotating stage 3 of the upper insulating portion 8a, a concave portion is provided.

The lower insulating portion 8b is provided on a side of a bottom surface inside the process chamber 2.

The heat insulating portion 8c for the lower heater is provided inside the placement portion 3a. The heat insulating portion 8c for the lower heater is provided between the lower heater 4 and the end portion on a closed side of the placement portion 3a.

The upper insulating portion 8a, the lower insulating portion 8b, and the heat insulating portion 8c for the lower heater can be, for example, a material obtained by arranging a plurality of a structural material in which fibrous carbon is coated with a film of C, SiC, TaC (tantalum carbide), or the like, or with a plurality of these films, or thin sheets of C or SiC, or those coated with the same material, or the like.

To one end portion of the elevating portion 8d, the lower insulating portion 8b is fixed. The other end portion of the elevating portion 8d is provided outside the process chamber 2. The other end portion of the elevating portion 8d is connected to an elevating device (not shown). The elevating portion 8d raises and lowers the lower insulating portion 8b. When performing film formation, the elevating portion 8d raises the lower insulating portion 8b. Then, as shown in FIG. 1, an end portion on a side of a ceiling of the lower insulating portion 8b and an end face on a side of a bottom surface of the upper insulating portion 8a are adhered to each other, and a vicinity of the substrate 100 is covered by the upper insulating portion 8a and the lower insulating portion 8b. When transporting the substrate 100, the susceptor 11, and the cover 12, the elevating portion 8d lowers the lower insulating portion 8b. Then, as shown in FIG. 2, a gap is formed between the lower insulating portion 8b and the upper insulating portion 8a. The substrate 100, the susceptor 11, and the cover 12 are transported between the inside and the outside of the process chamber 2 through the gap and the transport gate 2b.

The gas supply portion 9 has a gas source 9a, an on-off valve 9b, a gas control portion 9c, a nozzle 9d, and a heater 9e.

The gas source 9a supplies a process gas G. The gas source 9a can be, for example, a high-pressure cylinder, a plant pipe, or the like, in which the process gas G is contained.

The on-off valve 9b is provided between the gas source 9a and the nozzle 9d. The on-off valve 9b performs supply and stop of supply of the process gas G.

The gas control portion 9c is provided between the on-off valve 9b and the nozzle 9d. The gas control portion 9c controls a flow rate or a pressure of the process gas G. The gas control portion 9c can be, for example, a mass flow controller or the like.

One end portion of the nozzle 9d is provided inside the process chamber 2, and the other end portion is connected to the gas source 9a which supplies the process gas G. One end portion of the nozzle 9d is provided above the substrate 100 placed on the susceptor 11. A vicinity of the other end portion of the nozzle 9d is fixed to the ceiling of the process chamber 2.

The heater 9e is provided so as to surround an outer surface of the nozzle 9d. The heater 9e can heat the process gas G flowing inside the nozzle so that film formation easily occurs on the surface of the substrate 100. The heater 9e is not necessarily essential, however, for example, in the case where film formation is performed at a high temperature as in the case of an SiC film or the like, it is preferred to provide the heater 9e. However, when the temperature of the nozzle 9d is too high, a reaction product is formed on an inner wall of the nozzle 9d, which becomes a factor to generate a particle. Due to this, in the heating by the heater 9e, the temperature of the nozzle 9d is controlled so that it does not reach a temperature at which the reaction product is formed on the inner wall of the nozzle 9d.

Incidentally, in the above description, a case where one set of the gas source 9a, the on-off valve 9b, and the gas control portion 9c is provided is illustrated, however, the configuration is not limited thereto. For example, a plurality of sets of the gas source 9a, the on-off valve 9b, and the gas control portion 9c may be provided for each of a reaction gas, a carrier gas, and a dopant gas constituting the process gas G.

Further, it is also possible to provide a mixer for mixing the reaction gas, the carrier gas, and the dopant gas.

Further, it is also possible to provide a purge gas supply portion (not shown) which supplies a purge gas between the upper insulating portion 8a and the lower insulating portion 8b, and the inner wall of the process chamber 2, to a surface on an opposite side to the substrate 100 of the cover 12, or the like. The purge gas can be, for example, an inert gas such as argon gas. The purge gas supply portion can have a gas source, an on-off valve, a gas control portion, and a nozzle in the same manner as the gas supply portion 9. By allowing the purge gas to flow through a space other than a space between the cover 12 and the substrate 100, formation of the reaction product in an element provided inside the process chamber 2 can be suppressed, or a particle can be discharged.

The exhaust portion 10 is connected to a bottom portion of the process chamber 2 through a pipe. The exhaust portion 10 discharges the reacted gas or the residual process gas G flowing out from the surface of the substrate 100, and the purge gas to the outside of the process chamber 2. Further, the exhaust portion 10 can also make the pressure of the internal space of the process chamber 2 lower than atmospheric pressure. The exhaust portion 10 can be, for example, a vacuum pump or the like.

As shown in FIG. 3, the susceptor 11 has a flat plate shape. On a surface on an opposite side to the placement portion 3a of the susceptor 11, a concave portion 11a is provided. On a bottom surface of the concave portion 11a, the substrate 100 is placed. Further, in a central region of the susceptor 11, a hole 11b penetrating in a thickness direction is provided. Therefore, the susceptor 11 supports a vicinity of a periphery of a back surface (a surface on an opposite side where film formation is performed) of the substrate 100. Further, the back surface of the substrate 100 faces the lower heater 4. Therefore, the lower heater 4 can directly heat the substrate 100. Incidentally, the susceptor 11 may also be configured such that it does not have the hole 11b. In this case, the lower heater 4 heats the substrate 100 through the susceptor 11.

Further, at a periphery of a surface on which the concave portion 11a is provided of the susceptor 11, a plurality of columnar convex portions 11c is provided. It is preferred to provide at least three convex portions 11c on the circumference. When transporting the substrate 100, the susceptor 11, and the cover 12, as shown in FIG. 2, the cover 12 is placed on the top surfaces of the plurality of convex portions 11c. Due to this, the cover 12 and the substrate 100 can be prevented from coming into contact with each other.

The susceptor 11 is formed of a heat-resistant material. The susceptor 11 is formed of, for example, carbon, and also can be coated with SiC, TaC, or the like. However, the material of the susceptor 11 may be another material such as bulk SiC depending on the working temperature range.

The cover 12 is provided facing the susceptor 11 inside the process chamber 2. The cover 12 is provided between the upper heater 5 and the placement portion 3a (susceptor 11). The cover 12 has a flat plate shape. In a central region of the cover 12, a hole 12a penetrating in the thickness direction is provided. The hole 12a is provided at a position overlapping with an end portion of the nozzle 9d in plan view. When performing film formation, as shown in FIG. 1, the end portion of the nozzle 9d is inserted into the hole 12a. Therefore, the process gas G can be supplied to a space between the cover 12 and the substrate 100. Incidentally, a small gap is provided between the inner wall of the hole 12a and the nozzle 9d. Unless the inner wall of the hole 12a and the nozzle 9d come into contact with each other, generation of a particle due to friction can be suppressed.

The upper support portion 13 which is a support portion that supports the cover 12 from above has a projection portion 13a at a tip. Then, the other end of the upper support portion 13 is connected to an elevating and rotating mechanism (not shown), and can move vertically and also can rotate.

When transporting the substrate 100, the susceptor 11, and the cover 12, as shown in FIG. 2, the upper support portion 13 is lowered, the hole 12a is detached from the nozzle 9d, the cover 12 is placed on the columnar convex portion 11c of the susceptor 11, and thereafter, the upper support portion 13 is made to rotate to move the projection portion 13a to the outside of the cover 12 and detach the projection portion 13a from the cover 12. Therefore, the substrate 100, the susceptor 11, and the cover 12 can be transported together.

The cover 12 is formed of a heat-resistant material. The cover 12 is formed of, for example, carbon, which can be further coated with SiC, TaC, or the like. However, the material of the cover 12 may be another material such as bulk SiC depending on the working temperature range.

Further, the cover 12 can be divided into a plurality of portions.

Figure 4:
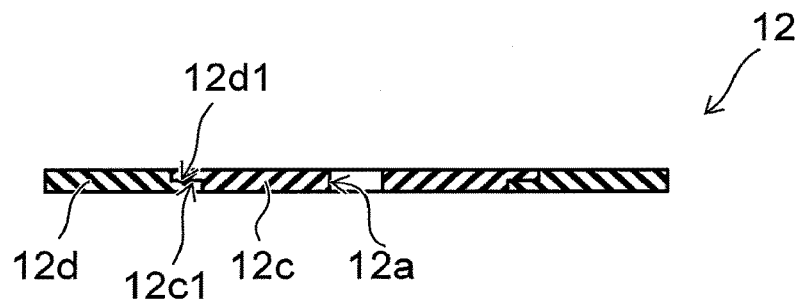
FIG. 4 is a schematic sectional view for illustrating the cover divided into a plurality of portions.

FIG. 4 is a schematic sectional view for illustrating the cover 12 divided into a plurality of portions.

As shown in FIG. 4, the cover 12 can be divided into a central portion 12c and a peripheral portion 12d.

In a central region of the central portion 12c, a hole 12a penetrating in the thickness direction is provided. At a periphery of the central portion 12c, a concave portion 12c1 is provided. The concave portion 12c1 opens on a surface on a side of the substrate 100 of the cover 12.

The peripheral portion 12d has an annular shape and is provided outside the central portion 12c. At an inner periphery of the peripheral portion 12d, a concave portion 12d1 is provided. The concave portion 12d1 opens on a surface on an opposite side to the substrate 100 of the cover 12. A bottom surface of the concave portion 12d1 is in contact with a bottom surface of the concave portion 12c1.

In the case where the cover 12 is placed on the top surfaces of the plurality of convex portions 11c of the susceptor 11, the peripheral portion 12d is supported by the plurality of convex portions 11c. Further, the central portion 12c is supported by the peripheral portion 12d.

When performing film formation, the peripheral portion 12d is supported by the upper support portion 13. Further, the central portion 12c is supported by the peripheral portion 12d.

Here, when performing film formation, the cover 12 is heated by the upper heater 5. In this case, a region with a different temperature may sometimes occur in the cover 12. Then, for example, in the case where film formation is performed at a high temperature as in the case of an SiC film or the like, an in-plane distribution of the temperature of the cover 12 may be increased. When the in-plane distribution of the temperature of the cover 12 is increased, the cover 12 may be warped or broken.

Therefore, the cover 12 is divided into a plurality of portions, and one portion (the peripheral portion 12d) is made to support an adjacent portion (the central portion 12c). According to this configuration, even if a region with a different temperature occurs in the cover 12, stress caused by a temperature difference can be alleviated, and therefore, the cover 12 can be prevented from being warped or broken.

Incidentally, the division number and division position are not limited to those illustrated. The division number and division position can be determined by performing an experiment or simulation.

Further, in the cover 12, a plurality of holes 12a can be provided.

Figure 5:
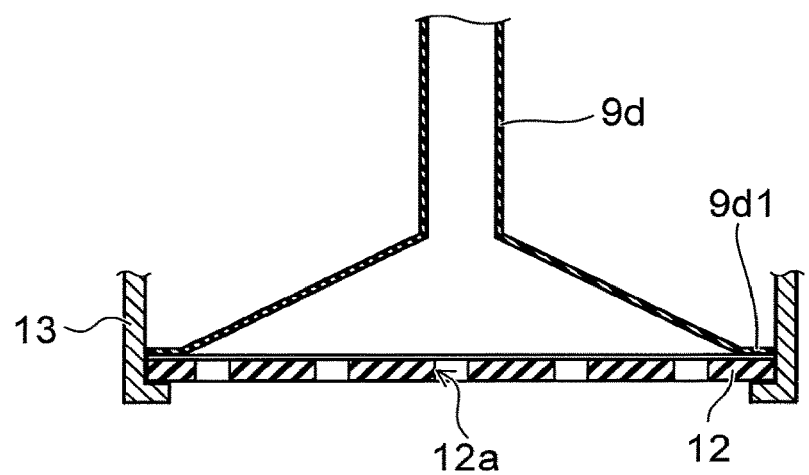
FIG. 5 is a schematic sectional view for illustrating the cover having a plurality of holes.

FIG. 5 is a schematic sectional view for illustrating the cover 12 having a plurality of holes 12a.

As shown in FIG. 5, a plurality of holes 12a penetrating in the thickness direction can be provided. By providing the plurality of holes 12a, a distribution of the process gas G can be controlled when the process gas G is supplied to a space between the substrate 100 and the cover 12. In this case, the distribution of the process gas G to be supplied can be controlled by the inner diameter dimension, arrangement position, pitch, number, etc. of the plurality of holes 12a. The distribution of the process gas G to be supplied can be determined by, for example, performing an experiment or simulation.

In the case of the cover 12 having a plurality of holes 12a, as shown in FIG. 5, an end portion on a side of the cover 12 of the nozzle 9d can be a portion having a funnel shape. The end portion on a side of the cover 12 of the nozzle 9d and a region where the plurality of holes 12a of the cover 12 is provided overlap with each other in plan view. According to this configuration, the process gas G can be supplied to the plurality of holes 12a. Further, on an outer surface of the end portion on a side of the cover 12 of the nozzle 9d, a flange portion 9d1 can be provided. The flange portion 9d1 has an annular shape, and a plane dimension of the flange portion 9d1 is larger than an outer diameter dimension of the end portion of the nozzle 9d. When performing film formation, as shown in FIG. 5, it is possible to provide a small gap between the flange portion 9d1 and the cover 12. Unless the flange portion 9d1 and the cover 12 come into contact with each other, generation of a particle due to friction can be suppressed. In this case, if a difference between the plane dimension of the flange portion 9d1 and the outer diameter dimension of the end portion of the nozzle 9d is about 20 mm, leakage of the process gas G through the gap between the flange portion 9d1 and the cover 12 can be suppressed. Further, by filling the outside of the nozzle 9d with a purge gas, leakage of the process gas G can be further suppressed.

The upper support portion 13 supports the cover 12. The upper support portion 13 supports a vicinity of a periphery of the cover 12. When performing film formation, as shown in FIG. 1, by the upper support portion 13, the cover 12 is provided at a predetermined position above the substrate 100. That is, when performing film formation, the upper support portion 13 moves the cover 12 to a predetermined position above the susceptor 11. In this case, the upper support portion 13 pulls up the cover 12 above the susceptor 11.

When transporting the substrate 100, the susceptor 11, and the cover 12, as shown in FIG. 2, the upper support portion 13 places the cover 12 on the top surfaces of the plurality of convex portions 11c of the susceptor 11. Further, after the cover 12 is placed on the top surfaces of the plurality of convex portions 11c of the susceptor 11, the upper support portion 13 is detached from the cover 12 by rotating itself and retreated to a predetermined position above the substrate 100.

That is, the upper support portion 13 can support the cover 12 at a first position above the susceptor 11, and can be separated from the cover 12 at a second position which is different from the first position.

Incidentally, the transport of the cover 12 can be performed for each film formation treatment, or the transport of the cover 12 can be performed according to need. For example, according to the allowable deposition amount of the reaction product in film formation, the cover 12 is placed on the top surfaces of the plurality of convex portions 11c of the susceptor 11, and the substrate 100, the susceptor 11, and the cover 12 can be transported together.

Further, it is also possible to place the cover 12 on the top surfaces of the plurality of convex portions 11c of the susceptor 11 on which the substrate 100 is not placed, and transport the susceptor 11 and the cover 12 together.

Further, it is also possible to transport the substrate 100 and the susceptor 11 together, and transport only the cover 12 separately.

Further, a case where the cover 12 is pulled up above by the upper support portion 13 is illustrated, however, a plurality of pins for pushing up the back surface of the cover 12 may be provided. In this case, the plurality of pins is provided outside the placement portion 3a, and the plurality of pins may push up the cover 12 to a predetermined position above the susceptor 11 (substrate 100).

The control portion 14 has a CPU (Central Processing Unit), a memory device, an input device, a display portion, etc.

The CPU reads a program stored in the memory device, and controls an operation of each element provided in the film forming apparatus 1 based on the read program. The CPU controls, for example, an operation of the rotating stage 3, the lower heater 4, the upper heater 5, the gas supply portion 9, the exhaust portion 10, etc. based on the read program, and forms a desired film on the surface of the substrate 100. The CPU controls, for example, the push-up pin 7, the gate valve 2c, etc. based on the read program, and performs the transport of the substrate 100, the susceptor 11, and the cover 12. The input device inputs information such as film formation conditions to the CPU or the like. The input device can be, for example, a key board, a mouse, or the like.

The display portion displays information such as film formation conditions, a warning, progress information in the film formation process, and so on. The display portion can be, for example, a liquid crystal display device, or the like.

The film forming apparatus 1 according to the embodiment includes the cover 12 provided at a predetermined position above the substrate 100 when performing film formation. Therefore, the process gas G supplied from the nozzle 9d can be efficiently guided to the surface of the substrate 100.

Further, the volume of the space (the space where film formation is performed) between the cover 12 and the substrate 100 is small, and therefore, the flow of the process gas G becomes smooth, and heat convection can be suppressed. Due to this, uniformity of film formation is not deteriorated. Further, a time for changing the type of gas can be decreased, and also adhesion of the reaction product generated on the surface of the substrate or in the vicinity of the substrate to a peripheral member including the cover 12 can be suppressed.

As a result, improvement of productivity can be achieved.

Further, the cover 12 can be separated from the upper support portion 13 or the susceptor 11. Therefore, the substrate 100, the susceptor 11, and the cover 12 can be transported together to the outside of the process chamber 2, and the cover 12 can be detached from the susceptor 11 outside the process chamber 2, and the cover 12 can be cleaned there. Alternatively, only the cover 12 is transported to the outside of the process chamber 2, and the cover 12 can be cleaned outside the process chamber 2.

Therefore, even if the cover 12 is heated by the upper heater 5 and the reaction product is formed on the surface on a side of the substrate 100 of the cover 12, the reaction product formed on the cover 12 can be removed outside the process chamber 2. Incidentally, when the reaction product formed on the cover 12 is Si, the reaction product can be removed by, for example, washing using hydrofluoric-nitric acid.

If the reaction product formed on the cover 12 can be removed outside the process chamber 2, generation of a particle inside the process chamber 2 can be suppressed. Therefore, the quality of a film formed on the substrate 100 can be improved.

Here, when the film forming apparatus 1 is stopped for cleaning or the like, it is necessary to adjust the environment for restarting the device. For example, it is necessary to set the internal pressure, temperature, etc. of the process chamber 2 within a predetermined range. Therefore, considerable time and labor are needed until the restart can be performed.

In this case, if a plurality of covers 12 is prepared in advance, the film forming apparatus 1 can also be operated while the cover 12 is cleaned. Therefore, the film forming apparatus 1 can be continuously operated, and thus, the productivity can be improved.

Further, the cover 12 is a simple plate-shaped body, and therefore, the production cost can be kept low. Therefore, even if a plurality of covers 12 is prepared, an increase in production cost can be suppressed. In addition, the cover 12 is a simple plate-shaped body, and therefore, cleaning is easy.

Further, the cover 12 is in a state of rest during film formation, and the substrate 100 is in a rotating state.

By the gas discharged from the substrate 100, the process gas G can be newly supplied to the surface of the substrate 100, and thus, the film formation speed can be increased. Due to this, the film formation efficiency can be improved.

Next, along with the effect of the film forming apparatus 1, a film forming method according to the embodiment will be illustrated. Incidentally, here, a case where the substrate 100, the susceptor 11, and the cover 12 are transported together, and the cover 12 is supported by the upper support portion 13 will be described as an example.

First, outside the process chamber 2, the substrate 100 is placed on the concave portion 11$a$ of the susceptor 11, and the cover 12 is placed on the top surfaces of the plurality of convex portions 11$c$ of the susceptor 11.

The substrate 100 can be, for example, a silicon wafer, an SiC wafer, a sapphire wafer, or the like. However, there is no particular limitation on the type, size, or the like of the substrate 100.

Further, as the susceptor 11, a member, the entire surface of which is in the form of a plate with no hole 11$b$ is used, and a plurality of substrates 100 is placed on the susceptor 11, and film formation may be performed on the plurality of substrates 100 simultaneously.

Subsequently, by the transport device (not shown), the substrate 100, the susceptor 11, and the cover 12 are transported to the inside of the process chamber 2 through the transport gate 2$b$.

Subsequently, the push-up pin 7 is raised, and receives the substrate 100, the susceptor 11, and the cover 12 from the transport device.

Subsequently, the transport device is retreated to the outside of the process chamber 2, and by the gate valve 2$c$, the opening of the transport gate 2$b$ is closed.

Subsequently, by the elevating portion 8$d$, the lower insulating portion 8$b$ is raised, and the end portion on a side of the ceiling of the lower insulating portion 8$b$ and the end face on a side of the bottom surface of the upper insulating portion 8$a$ are adhered to each other. Therefore, a vicinity of the substrate 100 is covered by the upper insulating portion 8$a$ and the lower insulating portion 8$b$.

Further, the push-up pin 7 is lowered, and the susceptor 11 is placed and held on the placement portion 3$a$.

Subsequently, by the upper support portion 13, the cover 12 is separated from the susceptor 11, and the cover 12 is provided at a predetermined position above the substrate 100. At this time, the end portion of the nozzle 9$d$ is inserted into the hole 12$a$.

Subsequently, a desired film is formed on the surface of the substrate 100.

At this time, by the exhaust portion 10, the internal pressure of the process chamber 2 is brought to a predetermined pressure.

Further, by the rotating stage 3, the susceptor 11 and the substrate 100 are rotated at a predetermined rotation speed. Further, by the lower heater 4 and the upper heater 5, the substrate 100 is heated to a predetermined temperature. Incidentally, by supplying cooling water to the flow channel 2$a$, the temperature of the process chamber 2 is prevented from being increased to a high temperature.

Further, by the gas supply portion 9, the process gas G is supplied to a space between the cover 12 and the substrate 100 through the nozzle 9$d$.

By rotating the substrate 100 at a predetermined rotation speed, the process gas G comes into contact with the entire surface of the substrate 100, and the reacted gas and the residual process gas G are discharged from a periphery of the substrate 100. At this time, a reaction of the process gas G occurs on the surface of the substrate 100 heated to the predetermined temperature, whereby a desired film is formed on the surface of the substrate 100.

The film formation conditions can be changed as appropriate according to the film to be formed, the material of the substrate 100, etc.

For example, in the case where a silicon film is formed on the surface of a silicon wafer, the film formation conditions can be set as follows.

As the process gas G, for example, a mixed gas of a reactive gas, a carrier gas, and a dopant gas can be used. The reactive gas can be, for example, dichlorosilane ($SiH_2Cl_2$) or the like. The carrier gas can be, for example, hydrogen gas or the like. The dopant gas can be, for example, diborane ($B_2H_6$), phosphine ($PH_3$), or the like.

The supply amount of dichlorosilane can be set to, for example, 50 sccm (standard cubic centimeter per minute) to 4 SLM (standard liter per minute).

The supply amount of hydrogen gas can be set to, for example, 20 SLM to 100 SLM.

Incidentally, the supply amount of the dopant gas may be set to a small amount.

The internal pressure of the process chamber 2 can be set to, for example, 1333 Pa to atmospheric pressure.

The rotation speed of the substrate 100 can be set to, for example, about 50 rpm to 1500 rpm.

The temperature of the substrate 100 can be set to 900° C. or higher.

For example, in the case where an SiC film is formed on the surface of an SiC substrate, the film formation conditions can be set as follows.

As the process gas G, for example, a mixed gas of a reactive gas, a carrier gas, and a dopant gas can be used. The reactive gas can be, for example, monosilane ($SiH_4$) and propane gas ($C_3H_8$), or the like. The carrier gas can be, for example, hydrogen gas or the like. The dopant gas can be, for example, nitrogen gas or the like.

The supply amount of monosilane and propane gas can be set to, for example, 1 sccm to 500 sccm.

The supply amount of hydrogen gas can be set to, for example, 20 SLM to 300 SLM.

Incidentally, the supply amount of the dopant gas may be set to a small amount.

The internal pressure of the process chamber 2 can be set to, for example, 1333 Pa to atmospheric pressure.

The rotation speed of the substrate 100 can be set to, for example, about 50 rpm to 1500 rpm.

The temperature of the substrate 100 can be set to 1500° C. or higher.

Subsequently, the substrate 100 on which a desired film is formed is transported to the outside of the process chamber 2.

First, by the gas supply portion 9, supply of the process gas G is stopped.

Further, heating of the substrate 100 by the lower heater 4 and the upper heater 5 is stopped.

Further, by the rotating stage 3, the rotation of the susceptor 11 and the substrate 100 is stopped.

Subsequently, by the upper support portion 13, the cover 12 is placed on the top surfaces of the plurality of convex portions 11*c* of the susceptor 11.

Subsequently, by the elevating portion 8*d*, the lower insulating portion 8*b* is lowered, and a gap is formed between the end portion on a side of the ceiling of the lower insulating portion 8*b* and the end face on a side of the bottom surface of the upper insulating portion 8*a*.

Further, the push-up pin 7 is raised, and the substrate 100, the susceptor 11, and the cover 12 are separated from the placement portion 3*a*.

Subsequently, by the gate valve 2*c*, the opening of the transport gate 2*b* is opened, and the transport device enters inside the process chamber 2 through the transport gate 2*b*. At this time, the transport device enters between the susceptor 11 and the placement portion 3*a*.

Subsequently, the push-up pin 7 is lowered, and the substrate 100, the susceptor 11, and the cover 12 are delivered to the transport device.

Subsequently, the transport device is retreated to the outside of the process chamber 2, and the substrate 100, the susceptor 11, and the cover 12 are transported to the outside of the process chamber 2.

In this manner, a desired film can be formed on the surface of the substrate 100.

Further, by repeating the above-mentioned procedure, the substrate 100 on which a desired film is formed can be continuously manufactured. That is, a continuous film formation treatment can be performed.

Further, as described above, the film forming method according to the embodiment can include the following processes.

A process for moving the cover 12 to a predetermined position above the substrate 100 placed on the susceptor 11.

A process for heating the substrate 100.

A process for supplying the process gas G to a space between the substrate 100 and the cover 12.

In addition, the method can further include the following processes.

A process for placing the cover 12 on the susceptor 11.

A process for transporting the susceptor 11 on which the cover 12 is placed.

Incidentally, the contents of the respective processes can be the same as those described above, and therefore, a detailed description thereof is omitted.

Next, a cover according to another embodiment will be illustrated.

Figure 6:
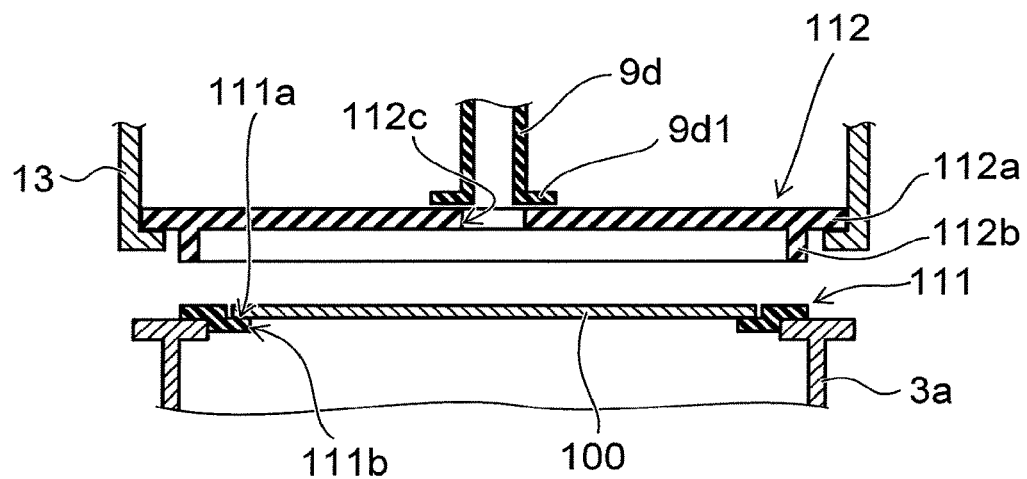
FIG. 6 is a schematic sectional view for illustrating a cover according to another embodiment.

FIG. 6 is a schematic sectional view for illustrating a cover 112 according to another embodiment.

As shown in FIG. 6, the cover 112 has a base portion 112*a* and a convex portion 112*b*.

The base portion 112*a* has a flat plate shape. In a central region of the base portion 112*a*, a hole 112*c* penetrating in a thickness direction is provided.

The convex portion 112*b* is provided on a surface on a side of a susceptor 111 of the base portion 112*a*. The convex portion 112*b* is provided in an annular shape or a dot shape. The process gas G supplied from the nozzle 9*d* is supplied to a space between the cover 12 and the substrate 100 through the hole 112*c*. The film forming method is as described above.

Further, by making the inner diameter dimension of the convex portion 112*b* larger than the external dimension of the substrate 100, when the cover 112 is placed on the susceptor 111, the cover 112 and the substrate 100 do not come into contact with each other. Therefore, the above-mentioned plurality of convex portions 11*c* can be omitted.

The material of the cover 112 can be the same as the material of the cover 12.

Further, as shown in FIG. 6, in an end portion on a side of the cover 112 of the nozzle 9*d*, a flange portion 9*d*1 can be provided. The flange portion 9*d*1 has an annular shape, and a plane dimension of the flange portion 9*d*1 is larger than an outer diameter dimension of the end portion of the nozzle 9*d*. As described above, by providing the flange portion 9*d*1, leakage of the process gas G from the gap between the flange portion 9*d*1 and the cover 112 can be suppressed. In this case, if a difference between the plane dimension of the flange portion 9*d*1 and the outer diameter dimension of the end portion of the nozzle 9*d* is about 20 mm, leakage of the process gas G can be suppressed. Further, by filling the outside of the nozzle 9*d* with a purge gas, leakage of the process gas G can be further suppressed.

Figure 7:
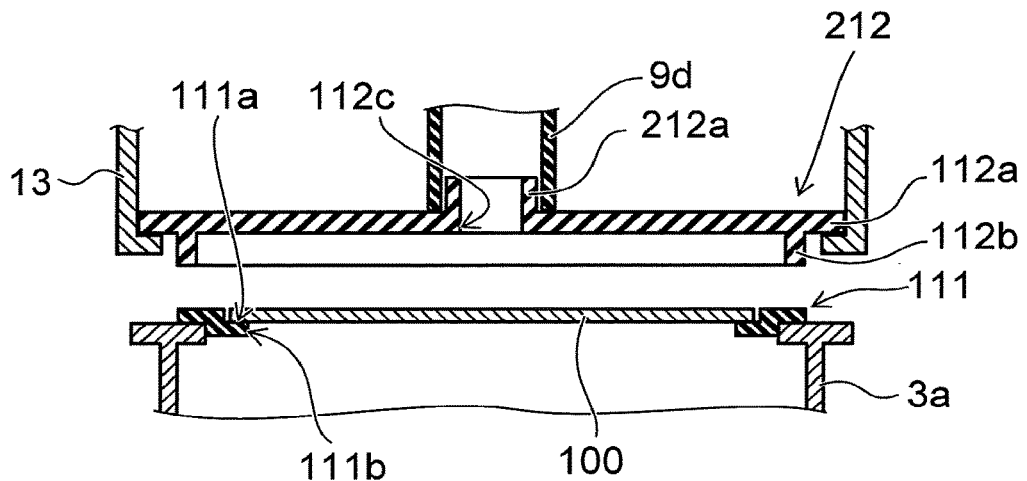
FIG. 7 is a schematic sectional view for illustrating a cover according to another embodiment.

FIG. 7 is a schematic sectional view for illustrating a cover 212 according to another embodiment.

As shown in FIG. 7, the cover 212 has a base portion 112*a*, a convex portion 112*b*, and a connecting portion 212*a*.

The connecting portion 212*a* is provided on a surface on an opposite side where the convex portion 112*b* of the base portion 112*a* is provided. The connecting portion 212*a* protrudes from a surface on an opposite side to the susceptor 111 of the base portion 112*a*. In the connecting portion 212*a*, a hole 112*c* is provided.

The material of the cover 212 can be the same as the material of the cover 12.

When performing film formation, as shown in FIG. 7, the connecting portion 212*a* is inserted into the nozzle 9*d*. At this time, it is possible to provide a small gap between the outer surface of the connecting portion 212*a* and the inner wall surface of the nozzle 9*d*. Unless the connecting portion 212*a* and the nozzle 9*d* come into contact with each other, generation of a particle due to friction can be suppressed. The process gas G cannot leak to an opposite side to the substrate 100 of the cover 212 without passing between the outer surface of the connecting portion 212*a* and the inner wall surface of the nozzle 9*d*, and between the base portion 112*a* and the end face of the nozzle 9*d*. Therefore, leakage of the process gas G can be suppressed. Further, by filling the outside of the nozzle 9d with a purge gas, leakage of the process gas G can be further suppressed.

Figure 8:
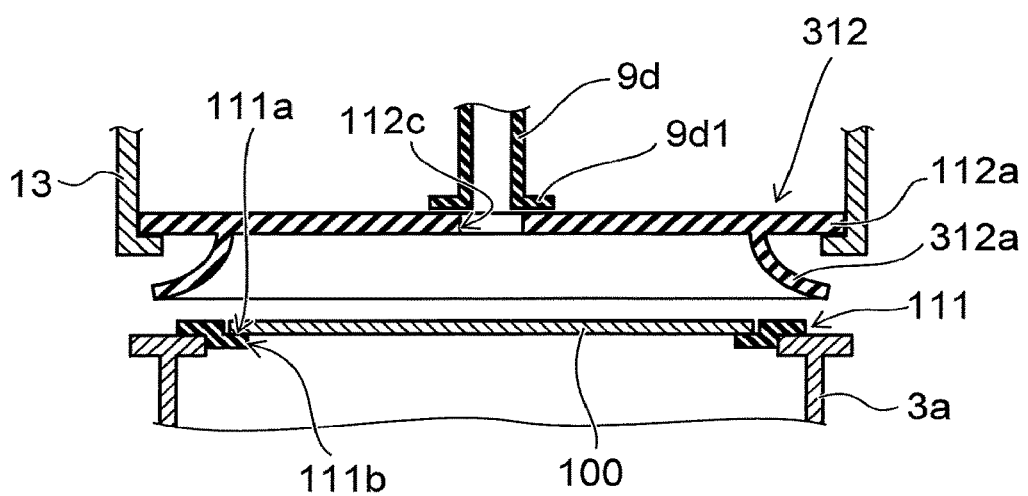
FIG. 8 is a schematic sectional view for illustrating a cover according to another embodiment.

FIG. 8 is a schematic sectional view for illustrating a cover 312 according to another embodiment.

As shown in FIG. 8, the cover 312 has a base portion 112a and a convex portion 312a.

The inner diameter dimension of the convex portion 312a gradually increases as it approaches a surface on a side of the susceptor 111 of the base portion 112a. Therefore, even if heat convection occurs in the end portion of the substrate 100 and on the upper surface of the susceptor 111, the convection can be suppressed. If heat convection can be suppressed, the uniformity of film formation is not deteriorated. Further, a time for changing the type of gas can be decreased, and also adhesion of the reaction product generated on the surface of the substrate or in the vicinity of the substrate to a peripheral member including the cover 312 can be suppressed. As a result, the productivity can be improved. Incidentally, it is preferred to change the height (thickness) of the convex portion 312a, the inner diameter dimension thereof, etc. according to the conditions such as the type of film formation, the temperature, and the supply amount of a gas, and the effect of occurrence of heat convection.

Further, by making the inner diameter dimension of the convex portion 312a larger than the external dimension of the substrate 100, when the cover 312 is placed on the susceptor 111, the cover 312 and the substrate 100 do not come into contact with each other. Therefore, the above-mentioned plurality of convex portions 11c can be omitted.

The material of the cover 312 can be the same as or different from the material of the cover 12.

Figure 9:
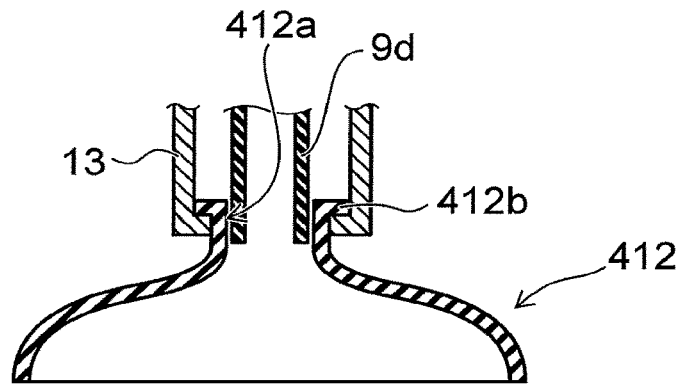
FIG. 9 is a schematic sectional view for illustrating a cover according to another embodiment.

FIG. 9 is a schematic sectional view for illustrating a cover 412 according to another embodiment.

As shown in FIG. 9, the cover 412 can be a cover having a funnel shape. In an end portion on a side where the inner diameter dimension of the cover 412 is smaller, an annular flange portion 412b can be provided. The upper support portion 13 can support the flange portion 412b. In an end portion on a side where the flange portion 412b is provided of the cover 412, a hole 412a for supplying the process gas G to a space between the cover 412 and the substrate 100 is provided.

When the cover 412 having a funnel shape is adopted, even if heat convection occurs in an end portion of the substrate 100 and an upper surface of the susceptor 111, the convection can be suppressed. If heat convection can be suppressed, the uniformity of film formation is not deteriorated. Further, a time for changing the type of gas can be decreased, and also adhesion of the reaction product generated on the surface of the substrate or in the vicinity of the substrate to a peripheral member including the cover 412 can be suppressed. As a result, the productivity can be improved. Incidentally, it is preferred to change the height of the cover 412, the inner diameter dimension on a smaller side of the funnel shape, and the inner diameter dimension on a larger side of the funnel shape.

By making the inner diameter dimension on a side of the substrate of the cover 412 larger than the external dimension of the substrate 100, when the cover 412 is placed on the susceptor 111, the cover 412 and the substrate 100 do not come into contact with each other. Therefore, the above-mentioned plurality of convex portions 11c can be omitted.

The material of the cover 412 can be the same as the material of the cover 12.

Further, the cover 412 can be divided into a plurality of portions.

Figure 10A:
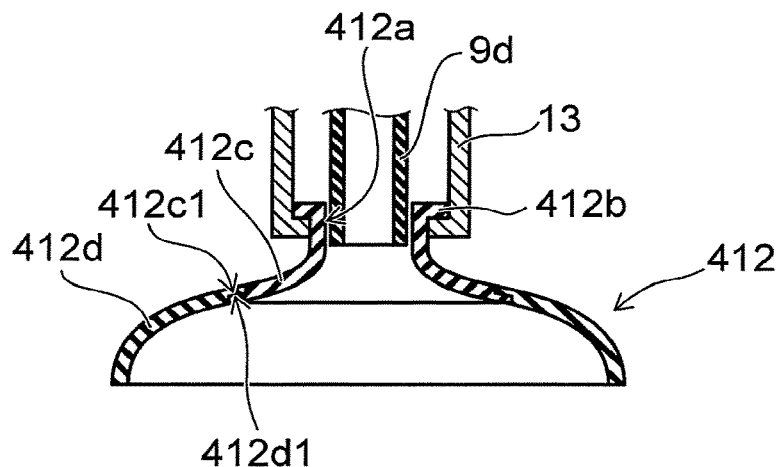
FIGS. 10A and 10B are schematic sectional views for illustrating the cover divided into a plurality of portions.
Figure 10B:
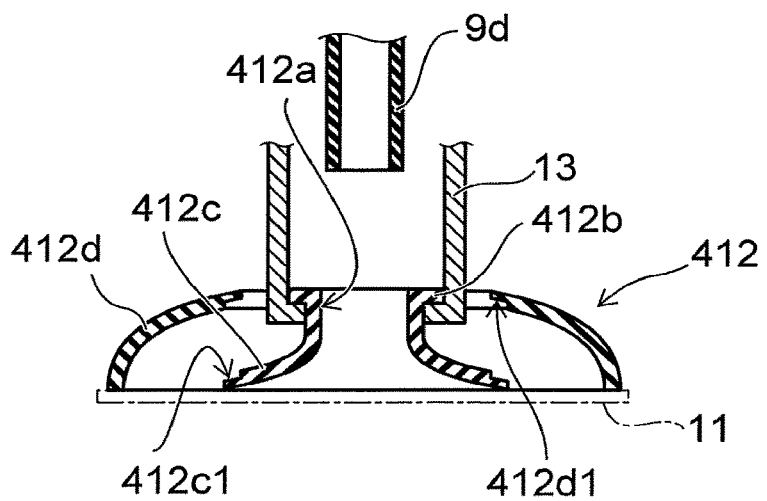

FIGS. 10A and 10B are schematic sectional views for illustrating the cover 412 divided into a plurality of portions.

As shown in FIG. 10A, the cover 412 can be divided into a central portion 412c and a peripheral portion 412d.

In an end portion of the central portion 412c, a flange portion 412b is provided. Further, in the central portion 12c, a hole 412a for supplying the process gas G to a space between the cover 412 and the substrate 100 is provided.

At a periphery of the central portion 12c, a concave portion 412c1 is provided. The concave portion 412c1 opens on a surface on an opposite side to the substrate 100 of the cover 412.

The planar shape of the peripheral portion 412d is an annular shape. The peripheral portion 412d is provided outside the central portion 412c. At an inner periphery of the peripheral portion 412d, a concave portion 412d1 is provided. The concave portion 412d1 opens on a surface on a side of the substrate 100 of the cover 412. A bottom surface of the concave portion 412d1 is in contact with a bottom surface of the concave portion 412c1.

When performing film formation, the central portion 412c is supported by the upper support portion 13. Further, the peripheral portion 412d is supported by the central portion 412c.

Here, the cover 412 is heated by the upper heater 5. Therefore, a region with a different temperature may sometimes occur in the cover 412.

In the same manner as the above-mentioned cover 12, the cover 412 is divided into a plurality of portions, and one portion (the central portion 412c) is made to support an adjacent portion (the peripheral portion 412d). Therefore, even if a region with a different temperature occurs in the cover 412, stress caused by a temperature difference can be alleviated, and therefore, the cover 412 can be prevented from being warped or broken. Incidentally, the division number and division position are not limited to those illustrated. The division number and division position can be determined by performing an experiment or simulation.

Here, the cover 412 has a funnel shape, and therefore, the height is increased. Therefore, it is necessary to increase the dimension of the opening of the transport gate 2b.

The cover 412 is divided, and therefore can be transported even if the dimension of the opening of the transport gate 2b is not increased. For example, when transporting the cover 412, as shown in FIG. 10B, the central portion 412c is housed inside the peripheral portion 412d. Therefore, the height of the cover 412 can be decreased during transport, and as a result, an increase in the dimension of the opening of the transport gate 2b can be suppressed.

Incidentally, when the substrate 100 is placed on the susceptor 111, the substrate 100 and the central portion 412c come into contact with each other. Therefore, when transporting the cover 412, the susceptor 111 on which the substrate 100 is not placed is used, or only the cover 412 is transported by the transport device.

Second Embodiment

Figure 11:
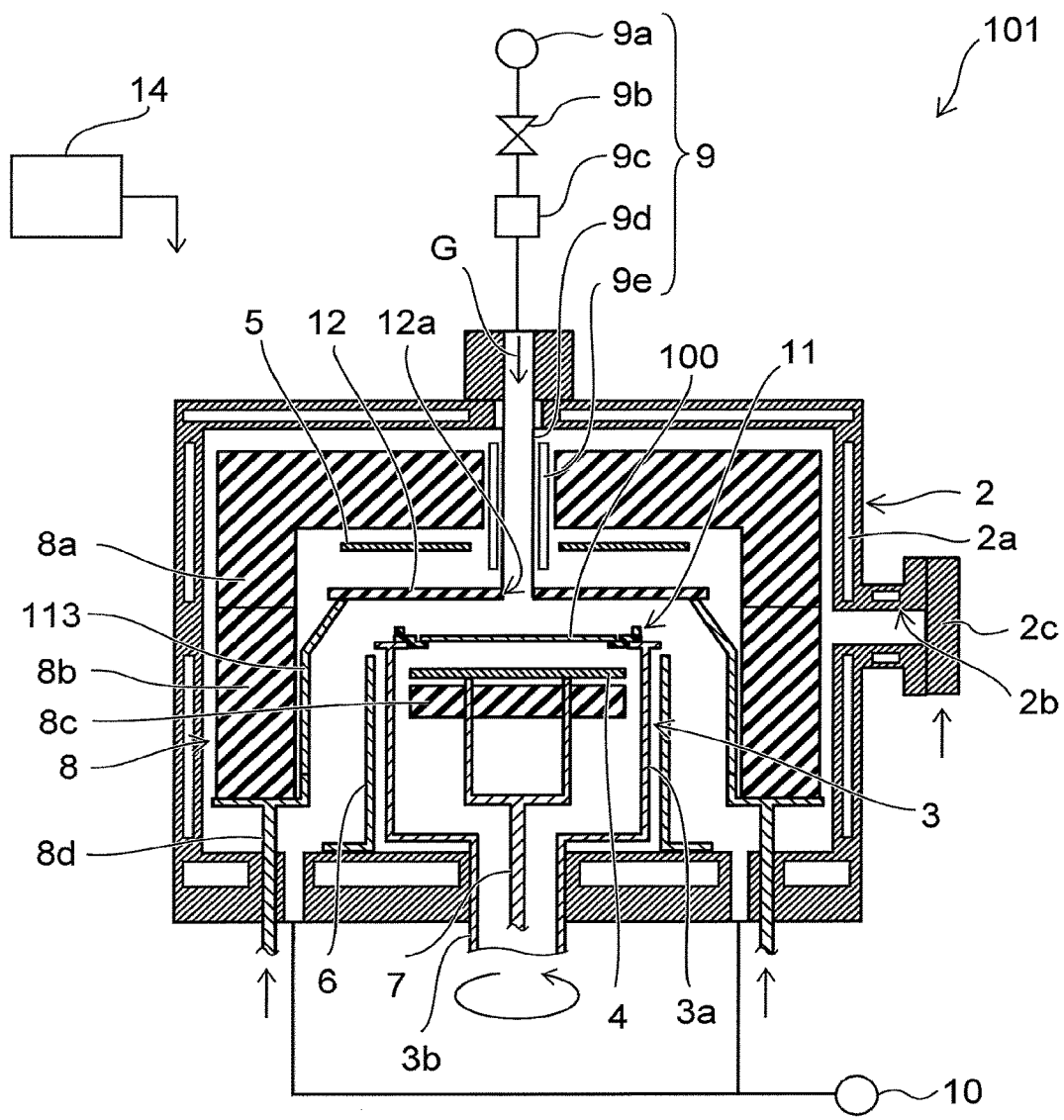
FIGS. 11 and 12 are schematic sectional views for illustrating a film forming apparatus according to a second embodiment.
Figure 12:
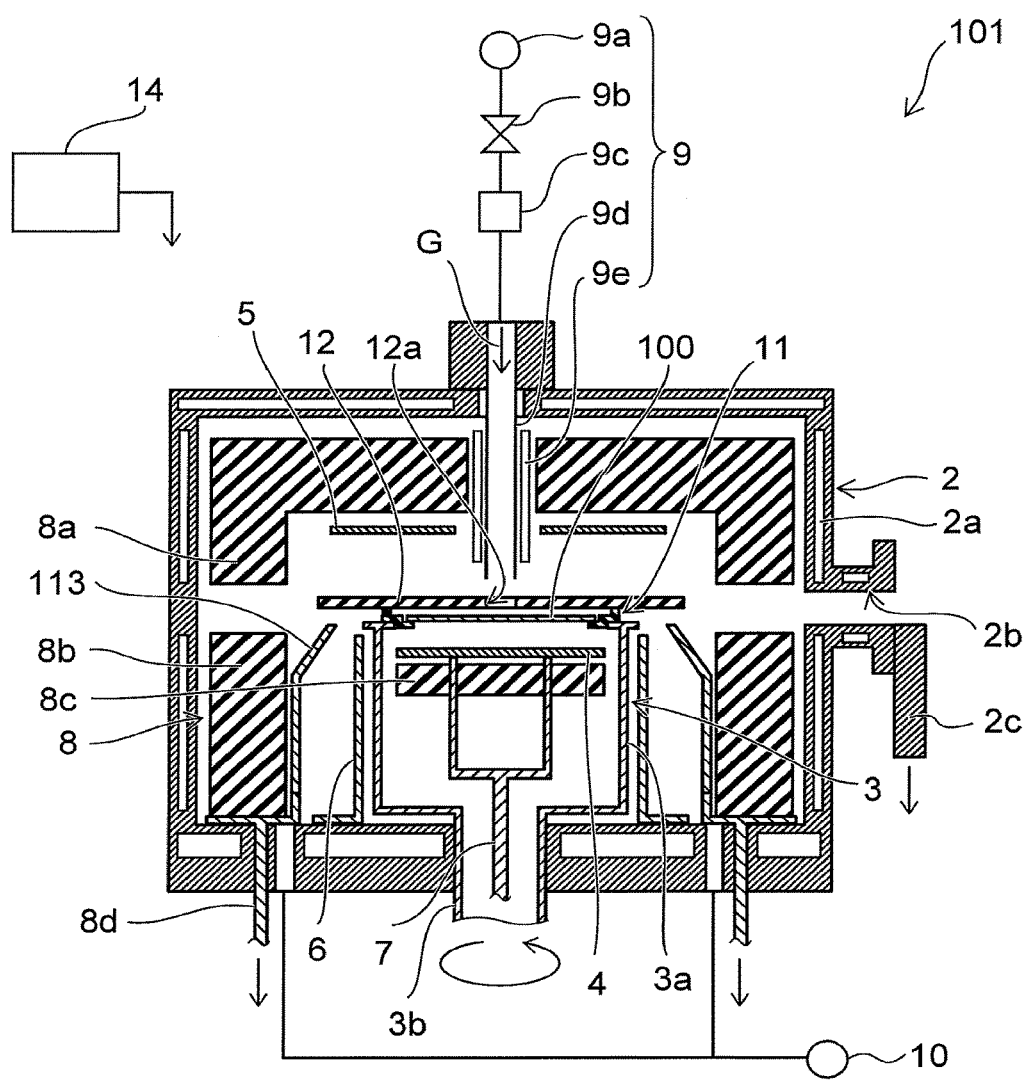

FIGS. 11 and 12 are schematic sectional views for illustrating a film forming apparatus 101 according to a second embodiment.

Incidentally, FIG. 11 shows a state when performing film formation, and FIG. 12 shows a state when transporting a substrate 100, a susceptor 11, and a cover 12.

As shown in FIGS. 11 and 12, in the film forming apparatus 101, a process chamber 2, a rotating stage 3, a lower heater 4, an upper heater 5, a rotating stage cover 6, a push-up pin 7, a heat insulating portion 8, a gas supply portion 9, an exhaust portion 10, a susceptor 11, a cover 12, a lower support portion 113, and a control portion 14 are provided.

That is, in the above-mentioned film forming apparatus 1, the upper support portion 13 is provided as a support portion, however, in the film forming apparatus 101 according to the embodiment, the lower support portion 113 which supports the cover from below is provided as a support portion.

The lower support portion 113 supports the cover 12. The lower support portion 113 supports a vicinity of a periphery of the cover 12. When performing film formation, as shown in FIG. 11, by the lower support portion 113, the cover 12 is provided at a predetermined position above the substrate 100. That is, the lower support portion 113 pushes up the cover 12 above the susceptor 11 (substrate 100).

When transporting the substrate 100, the susceptor 11, and the cover 12, as shown in FIG. 12, by the lower support portion 113, the cover 12 is placed on the top surfaces of a plurality of convex portions 11c of the susceptor 11. Further, after the cover 12 is placed on the top surfaces of the plurality of convex portions 11c of the susceptor 11, the lower support portion 113 is retreated to a predetermined position below the substrate 100.

That is, the lower support portion 113 can support the cover 12 at a first position above the susceptor 11, and can be separated from the cover 12 at a second position which is different from the first position.

As described above, when performing film formation, by the elevating portion 8d, the lower insulating portion 8b is raised. When transporting the substrate 100, the susceptor 11, and the cover 12, by the elevating portion 8d, the lower insulating portion 8b is lowered. Therefore, the lower support portion 113 can be provided for the elevating portion 8d.

Further, the lower support portion 113 has a cylindrical shape and surrounds the rotating stage cover 6. A vicinity of an end portion on a side of the cover 12 of the lower support portion 113 inclines inward. When performing film formation, the end portion on a side of the cover 12 of the lower support portion 113 and the cover 12 come into contact with each other. Therefore, a space between the lower support portion 113 and the rotating stage cover 6 serves as a discharge flow channel for discharging the reacted gas and the residual process gas G. In this case, a vicinity of the end portion on a side of the cover 12 of the lower support portion 113 inclines inward, and therefore, the reacted gas and the residual process gas G discharged from a periphery of the substrate 100 can be smoothly guided to the discharge flow channel. Due to this, the reacted gas can be prevented from being retained on the surface of the substrate 100.

Incidentally, in the above description, a "vertical film forming apparatus" in which the process gas G is supplied from a direction crossing the surface of the substrate 100 is illustrated. However, the invention can also be applied to a "horizontal film forming apparatus" in which the process gas G is supplied from a direction parallel to the surface of the substrate 100.

That is, a cover and a support portion are provided inside a process chamber of the "horizontal film forming apparatus", and when performing film formation, the cover is moved to a predetermined position above the susceptor, and when transporting the cover, the cover may be placed on the susceptor or the transport device. In the "horizontal film forming apparatus", the process gas G is supplied between the substrate 100 and the cover from a direction parallel to the surface of the substrate 100. Therefore, it is not necessary to provide a hole penetrating in a thickness direction in the cover.

Incidentally, a known technique can be applied to a basic structure of the "horizontal film forming apparatus", and therefore, a detailed description of the basic structure of the "horizontal film forming apparatus" is omitted.

Incidentally, in the above description, the structure in which the upper heater is provided is described, however, the upper heater is not necessarily essential. For example, if the substrate 100 can be heated to a predetermined temperature by the lower heater, it is not necessary to place the upper heater. However, even if the upper heater is not provided, the cover faces the substrate 100 whose temperature becomes high, and therefore, the temperature of the cover becomes high. Due to this, a reaction product such as a crystal is easily adhered to the cover. Therefore, it is preferred to apply the invention even in a configuration in which the upper heater is not provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A film forming apparatus, comprising:
    a process chamber;
    a placement portion provided inside the process chamber, the placement portion being configured to rotate around an axis of a rotation shaft;
    a susceptor held in an end portion of the placement portion and capable of placing a substrate;
    a cover capable of being placed facing the susceptor inside the process chamber;
    a gas source capable of supplying a process gas between the cover and the substrate;
    a heater capable of heating the substrate; and
    a support portion provided inside the process chamber and capable of supporting the cover at a first position above the susceptor at least while the placement portion and the susceptor rotate around the axis of the rotation shaft and capable of separating the cover at a second position which is different from the first position,
    the cover capable of being placed on the susceptor at the second position, the susceptor and the cover capable of being transported horizontally toward outside of the chamber.

2. The apparatus according to claim 1, wherein the support portion is capable of raising the cover to the first position when performing film formation, and is capable of lowering the cover to the second position when transporting the cover.

3. The apparatus according to claim 1, wherein the support portion has a convex portion for supporting the cover at a tip, and the support portion is separated from the cover by rotation.

4. The apparatus according to claim 1, wherein
the device further comprises a nozzle in which one end portion is provided inside the process chamber, and the other end portion is connected to the gas source,
the cover has a hole penetrating in a thickness direction, and
the hole is provided at a position overlapping with the one end portion of the nozzle in plan view.

5. The apparatus according to claim 4, wherein
the cover has a plate shape,
an annular convex portion is provided on a surface on a side of the susceptor of the cover, and
the convex portion surrounds a position where the substrate is placed in the susceptor in plan view.

6. The apparatus according to claim 5, wherein an inner diameter dimension of the convex portion gradually increases as separating from a surface on a side of the susceptor of the cover.

7. The apparatus according to claim 4, wherein an annular flange portion is provided on an outer surface of the one end portion of the nozzle.

8. The apparatus according to claim 4, wherein the device further comprises a connecting portion protruding from a surface on an opposite side to the susceptor of the cover and provided with the hole.

9. The apparatus according to claim 4, wherein a plurality of holes is provided.

10. The apparatus according to claim 4, wherein the one end portion of the nozzle is capable of being inserted into the hole.

11. The apparatus according to claim 1, wherein the cover is divided into a plurality of portions and one portion is capable of supporting an adjacent portion.

12. The apparatus according to claim 1, wherein the cover has a funnel shape.

13. The apparatus according to claim 1, wherein the support portion is capable of pulling up the cover above the susceptor when performing film formation.

14. The apparatus according to claim 1, wherein the support portion is capable of pushing up the cover above the susceptor when performing film formation.

15. The apparatus according to claim 1, wherein the heater is provided at least either inside the placement portion or on an opposite side to the susceptor of the cover.

16. The apparatus according to claim 1, wherein a gap can be formed between the nozzle and the cover.

17. The apparatus according to claim 1, wherein the cover contains at least carbon, SiC, and TaC.

18. The apparatus according to claim 1, further comprising:
a push-up pin capable of placing the susceptor on the placement portion and separating the susceptor from the placement portion.

19. A film forming method, comprising:
moving a cover to a predetermined position above a substrate placed on a susceptor;
rotating the substrate and the susceptor while holding the cover at the predetermined position;
heating the substrate;
supplying a process gas to a space between the substrate and the cover;
placing the cover on the susceptor; and
transporting the susceptor and the cover horizontally toward outside of a chamber.

* * * * *